(12) United States Patent
Wolf

(10) Patent No.: US 6,768,094 B2
(45) Date of Patent: Jul. 27, 2004

(54) PHOTO-VOLTAIC TRIGGER SYSTEM

(76) Inventor: Peter H. Wolf, 509 Raindance St., Thousand Oaks, CA (US) 91360-1219

( * ) Notice: Subject to any disclaimer, the term of this patent is extended or adjusted under 35 U.S.C. 154(b) by 189 days.

(21) Appl. No.: 10/224,674

(22) Filed: Aug. 20, 2002

(65) Prior Publication Data

US 2004/0036015 A1 Feb. 26, 2004

(51) Int. Cl.⁷ .............................................. H01L 31/00
(52) U.S. Cl. ..................... 250/214.1; 250/225
(58) Field of Search .......................... 250/214.1, 225, 250/226, 239, 216, 227.14

(56) References Cited

U.S. PATENT DOCUMENTS 3,676,671 A * 7/1972 Sheldon ...................... 250/368

* cited by examiner

*Primary Examiner*—Que T. Le
(74) *Attorney, Agent, or Firm*—Kelly Lowry & Kelley, LLP

(57) ABSTRACT

A trigger system including a photosensor having a polarizing light filter n positioned in a light receiving end of a housing. A lens is disposed in the housing for focusing light onto a transducer. A switch is electronically coupled to the transducer for selecting either a passive or active mode. In the active mode, a light source is directed at the photosensor, whereby a trigger signal is generated when an object disrupts the received light. In the passive mode, an opaque screen is spaced from the photosensor and a source of light is directed at the opaque screen, whereby a trigger signal is generated from the light reflected from an object positioned between the screen and photosensor. The trigger system may be electronically linked to a photographic system for high speed or action photography.

29 Claims, 5 Drawing Sheets

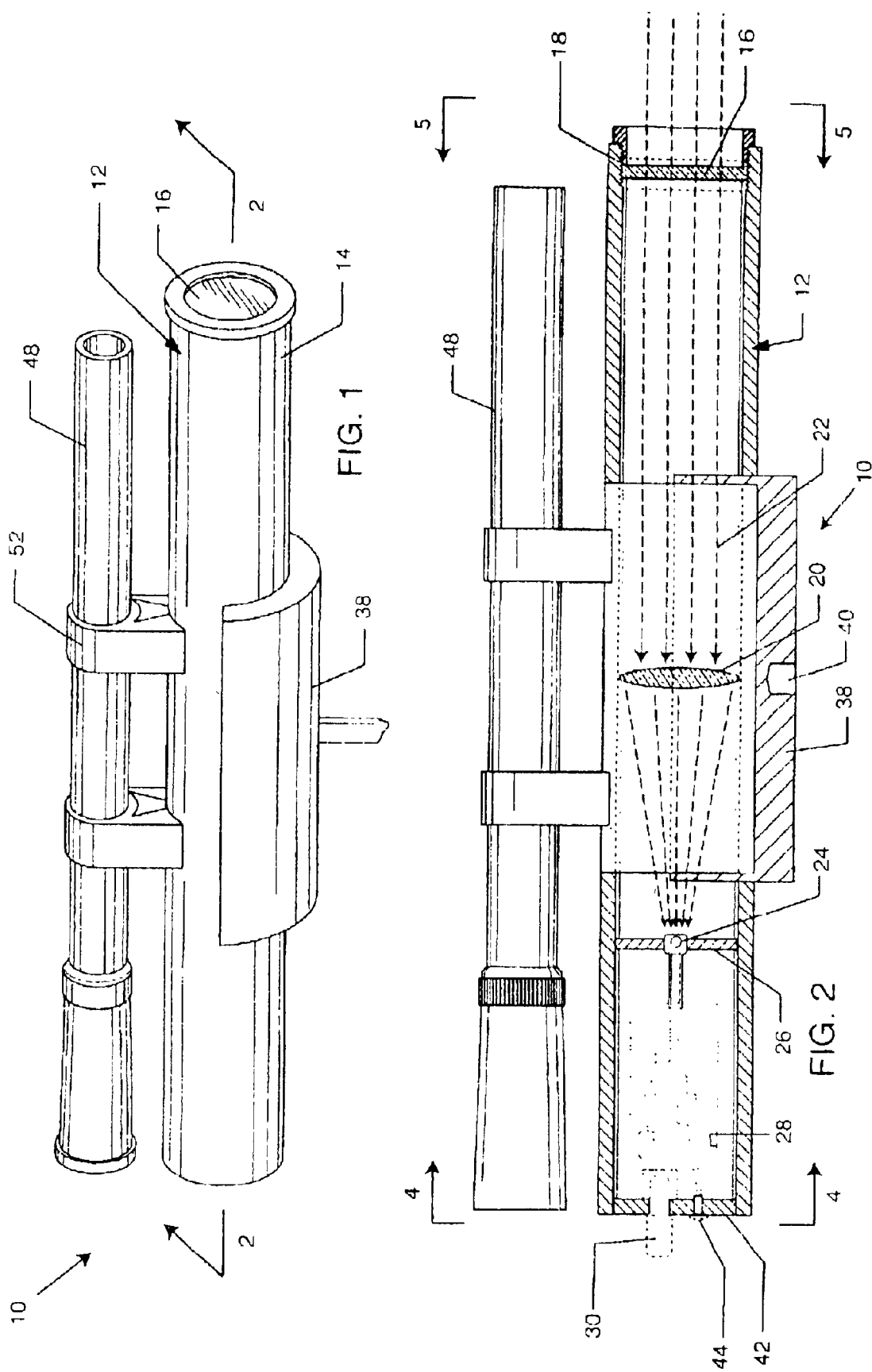

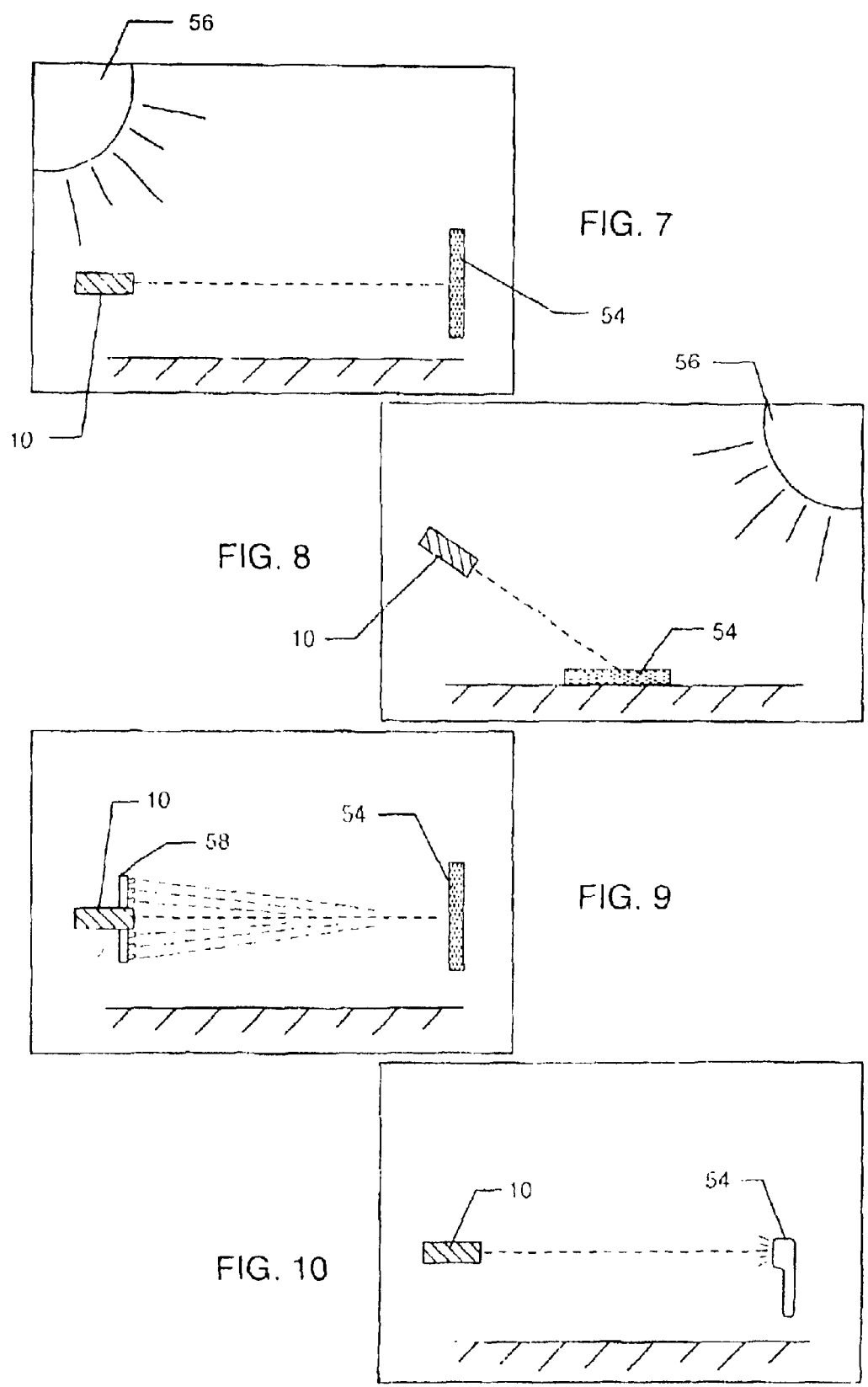

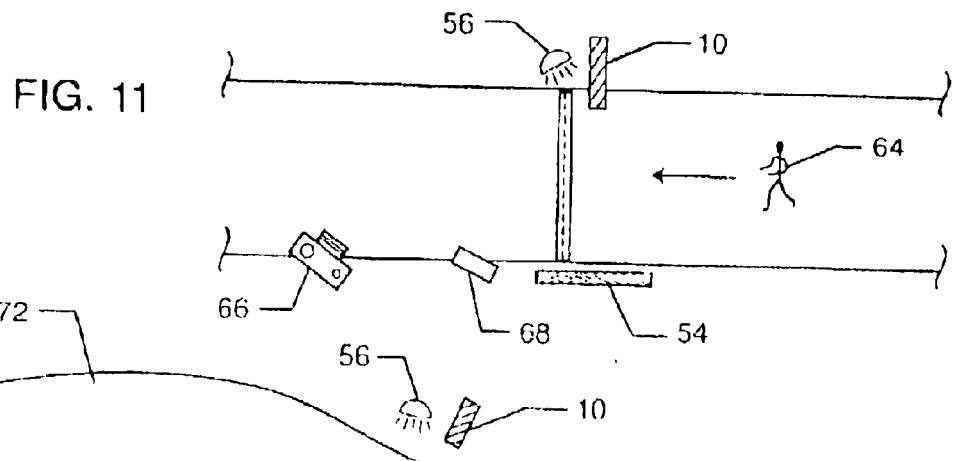
FIG. 11
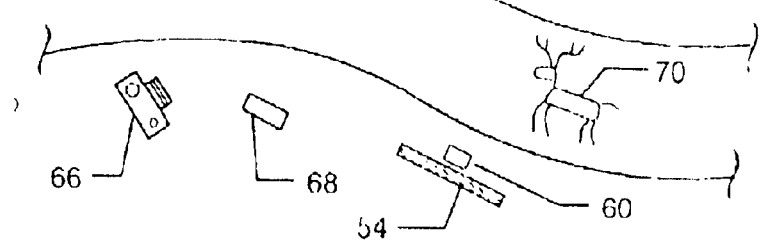
FIG. 12
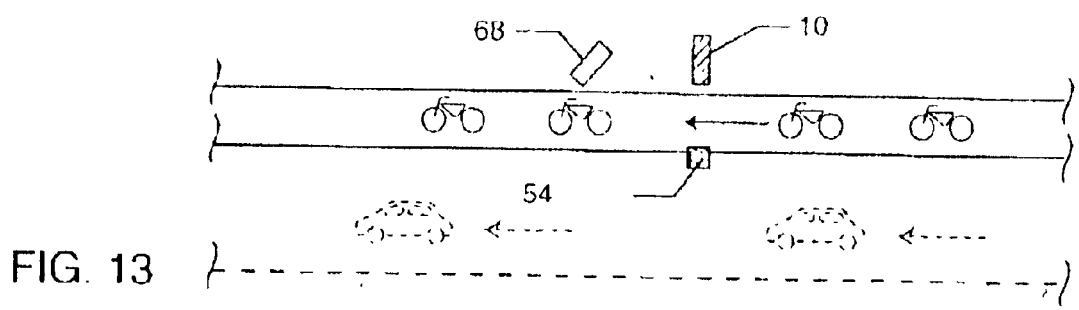
FIG. 13
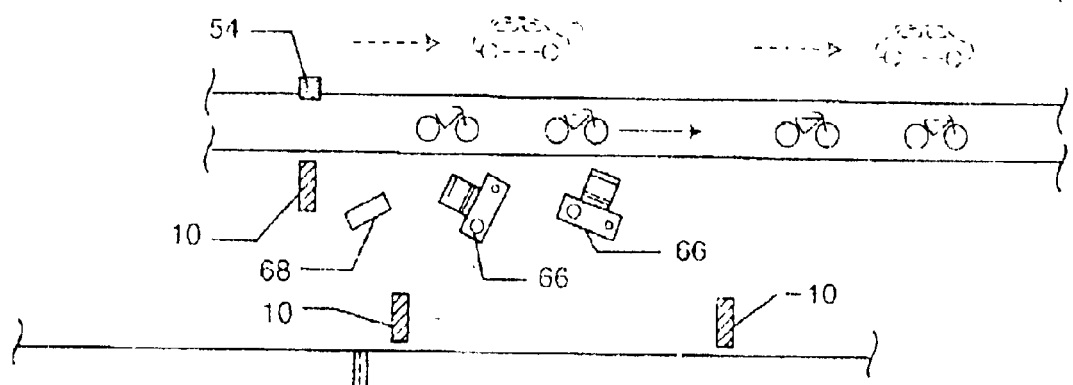
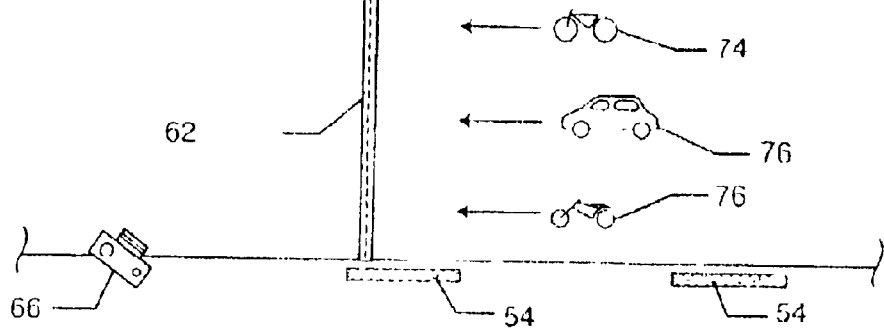
FIG. 14

PHOTO-VOLTAIC TRIGGER SYSTEM

BACKGROUND OF THE INVENTION

The present invention generally relates to trigger systems, such as those used in action and high speed photography and the like. More particularly, the present invention relates to a photo-voltaic trigger system operable in either a passive or active mode.

Light-activated trigger systems are well-known in the prior art and often used in security applications in which a laser beam or infrared beam is sent between a transmitter and a receiver. Once an object disrupts the beam, the receiver detects the absence of light and generates a signal, typically in the form of an alarm or the like.

Similar devices are used in the high speed and action photography industry. A light beam is sent between a transmitter and receiver, or the light beam is reflected between the transmitter/receiver and a reflector. Once an object, such as a flying bullet, running animal, skier, etc. passes through the beam, photographic equipment is activated to nearly instantaneously take a picture or video footage of the event. Similar results can be achieved using sensors to detect motion or sound.

However, all of the currently offered trigger systems have drawbacks. Many such systems require an electronic receiver which must be aligned with the transmitter. Aside from the difficulty of alignment, the system can be expensive as the user must purchase both a transmitter and a receiver. Other systems use a reflector aligned with the transmitter, which also serves as a receiver of the reflected beam of light. However, such systems have been found to be very difficult to set up and operate. This is particularly the case in outdoor or other unconventional settings in which the reflector and transmitter must be attached to trees, tripods, etc. and aligned with one another. Such systems are not able to be used in certain settings due to the arrangement of transmitter and receiver or reflector. For example, when photographing a bicycle race taking place on a highway, such tripods bearing the receiver or reflector cannot be placed in the road as oncoming automobiles can hit such tripods or supporting structures. Placing the transmitter on one side of the highway with the receiver or reflector on the opposite side of the highway will generate photos activated by passing cars as well as bicyclists.

Another disadvantage of such prior art systems is that many utilize a sharp, coherent light beam, such as a laser beam. It is well known that such intense beams of light can actually be harmful to the eyes of humans and animals.

Another disadvantage of such prior art systems is that they are all in a continuously active state. That is, the sound or light beam is continuously sent between the transmitter and receiver or reflector. The beam of sound or light must be disrupted before the trigger system is activated. This can require a tremendous amount of power. When filming or photographing a prolonged event, such as a marathon or other such similar event, access to a power source such as a generator may be required. In the event an electrical outlet is unavailable, a generator is unavailable, or a generator is undesirable, such as when filming wildlife, the photographer must transport back-up batteries in the event the initial batteries are exhausted.

Accordingly, there is a continuing need for a trigger system which overcomes the disadvantages of the prior art. Such a trigger system should be relatively easy to set up and operate. Such a system should be capable of operating in a passive, non-power consuming mode. In an active mode, such a trigger system should not utilize a light beam which is potentially harmful. The present invention fulfills these needs and provides other related advantages.

SUMMARY OF THE INVENTION

The present invention resides in a photo-voltaic trigger system. The system generally comprises a photosensor having a light-impermeable housing. A polarizing light filter is positioned in a light-receiving end of the housing. A lens is disposed in the housing for focusing received light onto a transducer.

In one preferred embodiment, the photosensor is directed towards an opaque screen. A source of light, which may comprise ambient light or an artificial light source in the visible or invisible spectrum, is at least partially directed at the screen. When an object enters the space between the screen and the photosensor, light is reflected off of the object and into the photosensor such that the transducer generates a trigger signal.

The light source may comprise an array of light emitting diodes. The array includes a plurality of groups of light emitting diodes which are powered in a predetermined sequence. Preferably, each group of light emitting diodes is oriented to direct light at a different angle with respect to the photosensor so that objects at varying distances from the photosensor may be detected.

In a particularly preferred embodiment, the trigger system includes a switch electronically coupled to the transducer for selecting either the aforementioned passive mode, or an active mode. Thus, a trigger signal is generated in the passive mode when light is reflected into the photosensor from the object. However, in the active mode, a light source is directed at the photosensor. The light source preferably comprises a non-coherent light source which may be on either the visible or invisible light spectrum. The trigger signal is generated when an object disrupts this received light.

In either the passive or active mode, a plurality of photosensors may be spaced apart from one another, and in the passive mode positioned generally opposite one or more opaque screens, each photosensor being electronically linked to a device for determining a variable of the object, such as location, distance, speed, etc.

A particularly preferred application of the trigger system of the present invention is electronically linking the photosensor to a photographic system. For example, the photosensor may be linked to a camera of a photographic system which is focused on the space between the photosensor and the screen. Once the object enters the space between the screen and the photosensor, a trigger signal is sent to the camera to activate it. Flash devices may be coupled with the camera and also activated by the trigger signal.

For ease of alignment and use, an alignment device may be attached to the housing of the photosensor, and the photosensor housing is preferably configured for attachment to a tripod or the like.

Other features and advantages of the present invention will become apparent from the following more detailed description, taken in conjunction with the accompanying drawings, which illustrate, by way of example, the principles of the invention.

BRIEF DESCRIPTION OF THE DRAWINGS

The accompanying drawings illustrate the invention. In such drawings:

FIG. 1 is a perspective view of a photosensor used in accordance with the present invention;

FIG. 2 is a partial cross-sectional view taken generally along line 2—2 of FIG. 1, illustrating components of the photosensor;

FIG. 7 is a schematic view of a photosensor directed at an opaque screen in a passive mode in accordance with the present invention;

FIG. 8 is another schematic view of a photosensor directed at an opaque screen placed on the ground;

FIG. 9 is a schematic view illustrating the use of an array of light emitting diodes in a passive mode in accordance with the present invention;

FIG. 10 is a schematic view of the invention in an active mode;

FIG. 11 is a schematic view of the invention as used in a foot race;

FIG. 12 is a schematic view of the invention in use in wildlife action photography;

FIG. 13 is a schematic view of the invention in use with a bicycle race for seating along a highway; and FIG. 14 is another schematic view of the present invention incorporating multiple photosensors in use in a high-speed race.

DETAILED DESCRIPTION OF THE PREFERRED EMBODIMENTS

Figure 3:
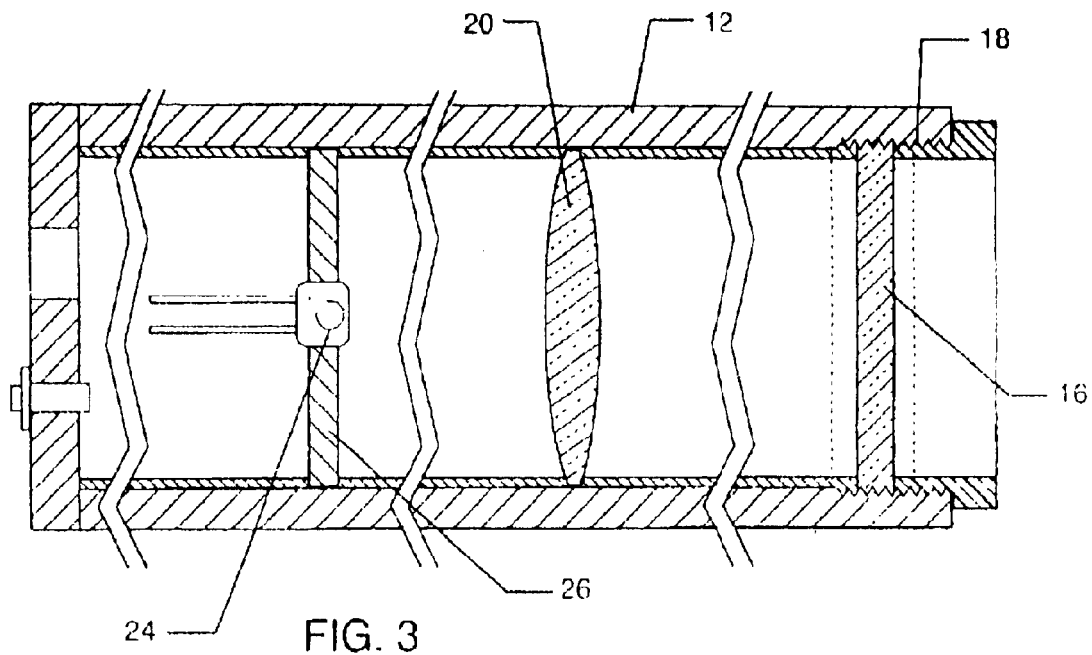
FIG. 3 is a fragmented cross-sectional view of the photosensor, illustrating key components thereof.

As shown in the drawings for purposes of illustration, the present invention is directed to a photo-voltaic trigger system which is operable in either a passive or active mode, as will be more fully described herein. The system of the present invention is versatile in its use, relatively easy to set-up, and easily operable. As will be seen from the following description, the system of the present invention is uncomplicated in construction and relatively inexpensive. Although the system of the present invention will be described herein in a preferred application of action or speed photography, it should be understood by the reader that the system of the present invention can be used in other applications as well, such as security systems, garage door safety systems, etc.

With reference now to FIGS. 1–5, a photosensor 10 used in accordance with the present invention is illustrated. The photosensor 10 comprises an elongated tubular housing 12 which is comprised of a light impermeable material, or otherwise coated so as to be light impermeable. A first end 14 of the housing 12 is open for reception of a light polarizing filter 16. As illustrated, the open end includes internal threads 18 for screw-on attachment of the polarizing filter 16. The light polarizing filter 16 serves to filter incoming light and direct the light at a generally transverse access to the filter 16 such that the light travels generally in a straight line through the housing, as illustrated.

A lens 20, such as the illustrated convex lens, is mounted within the housing 12 at a distance from the polarizing light filter 16. The lens 20 serves to focus the incoming light 22 onto a transducer 24. The transducer 24 comprises a photo transistor, such as a NPN Photo Transistor PN158, or the equivalent. As illustrated in FIGS. 2 and 3, the transducer 24 may be mounted on an interior wall 26 within the housing 12 to assure that the transducer 24 remains in a fixed location with respect to the lens 20 such that the light 22 entering the housing 12 will be focused upon the transducer 24. The transducer 24 is electronically coupled with a circuit 28 which, in a preferred embodiment, can be moved into the active or passive mode utilizing a switch 30.

Figure 6:
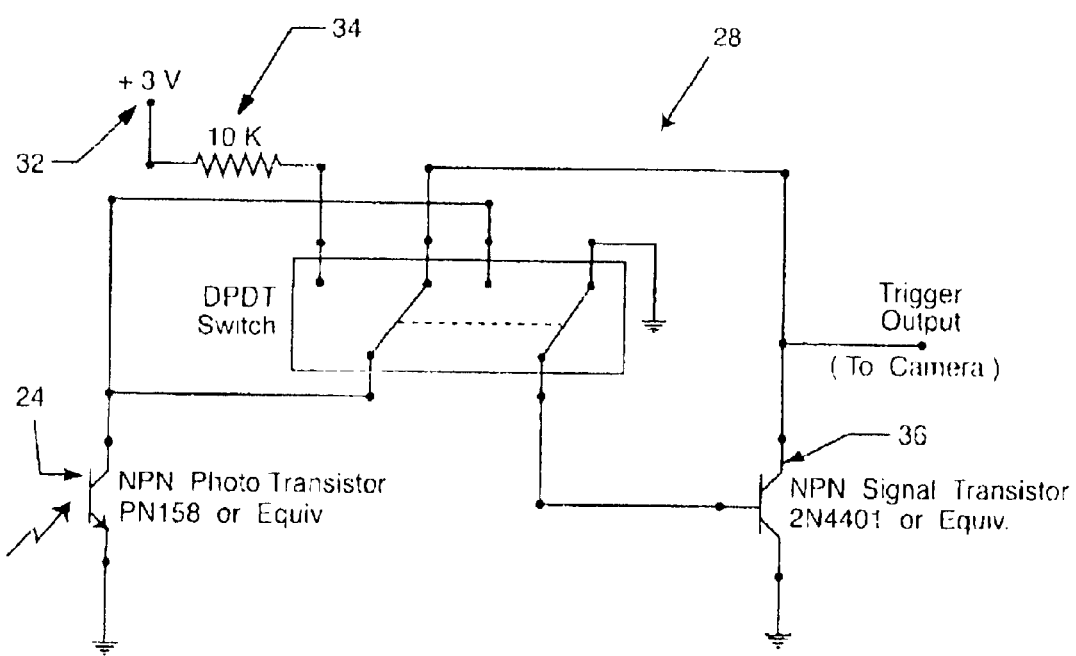
FIG. 6 is an electronic schematic of a transducer/trigger circuit used in accordance with the present invention.

With reference now to FIG. 6, the circuit 28 is illustrated containing the photo transistor transducer 24. The circuit 28 includes connection to a power source 32, such as a battery supporting a three volt input. A resistor 34, such as a 10 K Ohm resistor is in the electrical path between the power source 32 and the switch 30. The switch 30 comprises a DPDT switch such that it can be moved between two positions to power or connect different portions of the circuit 28. The circuit 28 is illustrated in the passive or "no light" operation. That is, as will be described more fully herein, light is not actively directed into the photosensor 10. When light is reflected into the photosensor 10, as will be described more fully herein, the photo transistor 24 activates. It will be noted that the photo transistor is directly connected to the trigger output, such as by electrical or radio frequency connection to a camera. In order to activate the trigger or switch of a camera, the camera must be brought to a very low voltage or grounded. The activation of the photo transistor transducer 24 causes the transducer 24 to ground, or substantially lower the voltage, of the camera, causing it to begin filming or open its shutter and expose film in order to take a still photograph.

It will be noted by those skilled in the art that the photo transistor 24 in this mode is not powered by the power source 32. Thus, while operating in this passive "no light" operation or mode, the photosensor 10 utilizes no external power. This can be extremely advantageous in applications where the photosensor 10 is used for a prolonged period of time, such as security applications, safety applications, and action and high-speed photography where pictures are taken over a prolonged time period, or a prolonged time period passes before the opportunity for a picture, such as an animal, is presented.

With continuing reference to FIG. 6, in the active mode or "light" operation, light is directed through the filter 16 and onto the transducer 24 continuously. The contact points of the switch are moved so that the photo transistor 24 is connected to the power supply 32. Due to the constant activation of the photo transistor 24, its collector remains at ground, pulling the base of the now connected signal transistor 36 to ground. Thus, the output device, such as the camera, remains at the threshold voltage. Any disruption of the light source will cause the photo transistor 24 collector to elevate to three volts, the voltage supplied by the power supply 32, causing the base of the signal transistor 36 to also elevate to 3 volts. So long as the base of the signal transistor illustrated rises above 0.7 volts, the collector of the signal transistor is pulled from 3 volts to ground. This causes the camera, or other attached device, to go to ground as well, thus triggering the camera or connected electronic device.

The aforementioned events are collectively referred to in this application as the creation of a trigger signal. It will be appreciated by those skilled in the art that for different output electronic device applications, the circuit may be modified somewhat in order to trigger the electronic device. However, the circuit 28 should be movable between active and passive modes in order to generate a trigger signal either due to the detection of light in the passive mode, or the disruption of a light source in the active mode.

Referring back to FIGS. 1–5, in a particularly preferred embodiment, the photosensor housing 12 is attached to a mount 38 which includes an internally threaded recess 40 for attachment to a standard tripod or the like. The end of the housing 12 generally opposite the filter 16 includes a back wall 42 in which is positioned the switch 30 for easy access, as well as ports 44 and 46 for the insertion/connection of a power cord extending from the power source, and an electrical lead extending to either a radio frequency transmitter or the electrical lead attached to the end electronic device, such as the camera.

Figure 4:
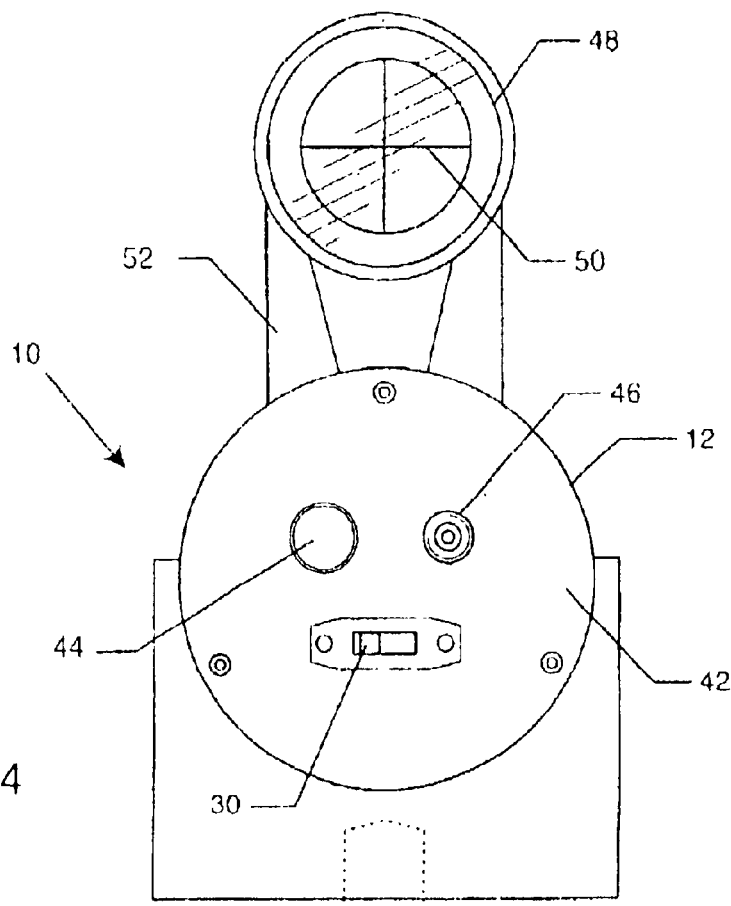
FIG. 4 is an end view of the photosensor taken generally along line 4—4 of FIG. 2.
Figure 5:
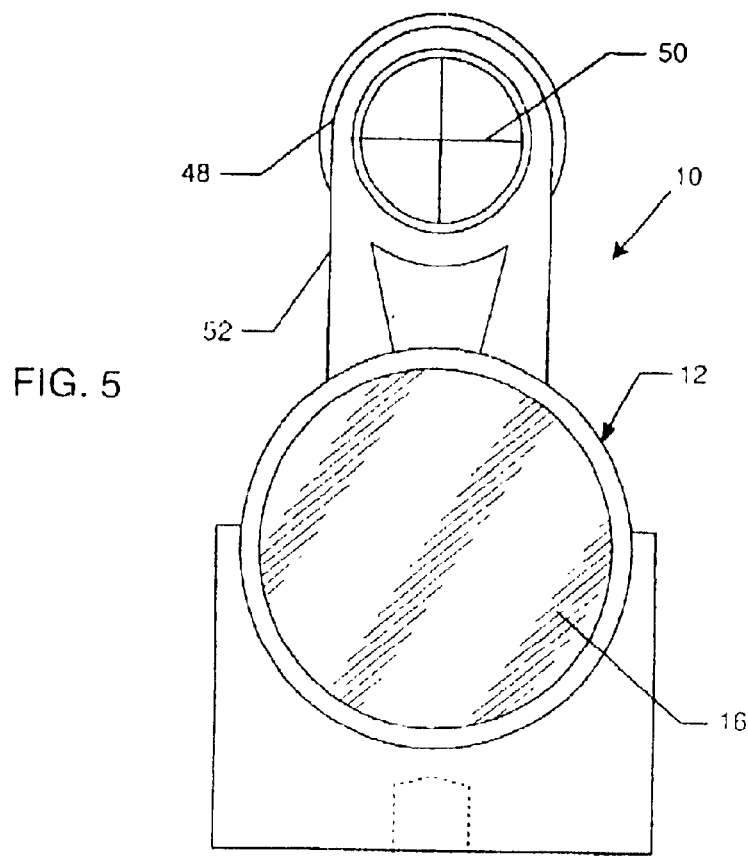
FIG. 5 is a front end view of the photosensor taken generally along 5—5 of FIG. 2.

The photosensor 10 preferably has an alignment device 48 associated therewith for properly aligning the filter 16. The alignment device 48 can comprise any one of a number of alignment devices, such as rifle-type sights, a cross-hair sight, or the illustrated rifle-type scope. Such scopes 48 typically include cross-hairs 50, as illustrated in FIGS. 4 and 5 which allow precise alignment of the photosensor 10. The alignment device may be attached to the housing 12 of the photosensor 10 by mounting brackets or members 52, tongue and groove connection, or any other connection suitable to securely attach the alignment device 48 to the housing 12.

With reference now to FIGS. 7–9, the schematic drawings illustrate operation of the trigger system of the present invention in a passive mode. With reference to FIG. 7, the photosensor 10 is directed to an opaque screen 54. The opaque screen may comprise a black felt screen, or any screen or object which is light absorbing or which otherwise does not reflect an appreciable amount of light. Black felt fabric is easy to mount under various circumstances. A light source, such as the illustrated ambient light from the sun 56 is at least partially directed onto the opaque screen 54. It should be understood that the light source can comprise an artificial light source, such as a flood light which may be in the visible or invisible light spectrum. The orientation of the photosensor 10 and screen 54 can vary so as to be horizontally disposed from one another, as illustrated in FIG. 7, disposed at an angle as shown in FIG. 8, or any other orientation. The alignment device 48 associated with the photosensor 10 allows the photosensor 10 to be directly aimed at the opaque screen 54, even at a distance. As described above, the photosensor 10 in this passive or "no light" mode does not require power. Once an object enters the space between the screen 54 and the photosensor 10, the object reflects light from the light source 56 into the photosensor 10 which then triggers the camera or other electronic device, as described above.

The use of back lighting as the light source is preferred, and sometimes necessary, due to variable sun light conditions such as shadows forming from clouds, surrounding objects, etc. However, due to the opaque, non-reflective nature of the screen 54 even a relatively bright flood light does not reflect sufficient light into the photosensor 10 to trigger it.

In a particularly preferred embodiment illustrated in FIG. 9, the light source comprises a light emitting diode array 58. Ultra bright LED's are available to provide very bright, pin point light sources that can be individually pointed along the photosensors center line towards the opaque screen 54. These LED's can also be fired sequentially at less than 100% duty cycle, allowing additional light power during short time intervals. In a particularly preferred embodiment, the array includes groups of LED's which are energized in sequence for a short duration, such as $1/10,000$ seconds. For example, there may be an array of 30 LED's surrounding the photosensor 10 and facing towards the screen 54. Groups of 3 LED's would be energized in sequence. One cycle to energize all 30 LED's would take only $1/1,000$ seconds. Only one group of 3 LED's would be energized at a time. Each group of 3 LED's would operate at 10% duty cycle. Each LED or group of LED's could be pointed at a different distance along the center line path between the photosensor 10 and the opaque screen 54. Any object now entering between the photosensor 10 and the screen 54 would reflect at least one or more LED's light energy into the photosensor 10, thus triggering it. The LED's could be directed or pointed at specific locations along the center line of the photosensor 10 in order to selectively trigger the photosensor 10 only on objects where the LED's are pointing. Conversely, the photosensor 10 in conjunction with the LED's pointing at different locations along the photosensors axis could be used to determine at what location between the photosensor 10 and the screen 54 an object triggered the photosensor 10. Knowing where the object passed in relation to the photosensor 10 could be very useful. For example, such information could assist in focusing the camera at the correct place to capture the object triggering the photosensor 10.

Using the 30 LED array, with 10 groups of 3 LED's, each group could point two feet farther away from the photosensor 10 than the previous group of 3 LED's. Thus, if the photosensor were triggered within the first $1/10,000$ seconds, the object triggering the photosensor 10 would be within two feet of the photosensor. However, if the photosensor was triggered at approximately $5/10,000$ seconds, then the object triggering the photosensor would be approximately ten feet from the photosensor 10. Using groups of 3 LED's is advantageous as each LED has a voltage drop of approximately 2 volts. This allows convenient use of readily available 6 volt batteries. Also, the 3 LED's energize need not be located adjacent to one another in the cluster, but preferably are spaced from one another, such as 120° apart.

With reference now to FIG. 10, a schematic drawing is shown illustrating the trigger system of the present invention in an active mode. That is, light from a light source 60 is directed into the photosensor 10. So as not to cause vision damage, the light source 60 preferably comprises a non-coherent non-laser light source, such as a flashlight or the like. Once again, the alignment device 48 associated with the photosensor housing 12 enables the photosensor 10 to be aligned with the light source 60. As described above, once the light source is disrupted by an object entering the space between the photosensor 10 and the light source 60, the photosensor 10, with the switch in the "active" mode, triggers the pertinent electronic device, such as a camera, alarm, etc.

With reference now to FIGS. 11–14, schematic drawings are provided illustrating the trigger system of the present invention in action or high-speed photography applications. With reference to FIG. 11, the photosensor 10 and screen 54 may be positioned opposite one another at a finish line 62 of a race. As runners 64 pass between the photosensor 10 and screen 54, light from the light source 56 is reflected from the runner 64 into the photosensor 10, thus triggering the passive photosensor and activating a camera 66 and flash device 68. The camera 66 can be positioned at some distance from the photosensor 10 and controlled using radio frequency or hard wired electrical leads. The camera 66 can be placed at an angle so as to focus along the finish line 62 without actually being immediately in front of the finish line 62. Utilizing the LED array 58, as described above, allows the camera 66 to be automatically focused at the proper point of the finish line 62 where the runner 64 passes so that the photograph is in focus. Of course, the camera 66 can also comprise a video camera or the like so as to film video.

With reference now to FIG. 12, the same set-up may be implemented in order to photograph an animal or the like, such as an animal traversing a path 72. The light source 56 can comprise a flood light. In the event that the flood light is determined to frighten the animal, such as during night conditions, the flood light 56 may emit a non-visible stream of light, such as infrared light. Thus, the photograph or video may be taken of the animal 70 while the animal is in its natural habitat and under non-artificial circumstances. Simultaneously illustrated in FIG. 12 is the use of a light source 60 such as flashlight or the like directly aimed at what would be the active mode photosensor 10. Once again, the light source 60 could be of a type which is invisible to the eye. Of course, either the screen 54 or light source 60 would be used, but not both simultaneously.

With reference now to FIG. 13, utilization of the opaque screen 54 allows the screen to be placed upon the ground and the photosensor 10 to be directed downwardly onto the screen 54, as shown in FIG. 8. This allows the screen 54 to be placed on the side of a highway. Thus, a bike race, for example, can be easily photographed automatically without fear of damaging equipment as the opaque screens 54 can be placed outside of the area of vehicle travel, or even if an automobile runs over the black felt screen 54, no damage will be done. An additional benefit of the present invention is that in a bicycle race wherein participating bicyclists ride a loop, a bicyclist can be photographed on both sides of the highway with the set-up illustrated in FIG. 13. For example, bicyclists beginning to ascend a hill can be photographed using the trigger system of the present invention on one side of the street, and photographed on the opposite side of the street coming down the hill. The camera 66 may be positioned adjacent to one another so that the photographer can have access to both cameras for the replacement of film and the like. The camera 66 positioned across the highway can have a telephoto lens or the like focused upon the space between the screen 54 and the photosensor 10. Flash devices 68 can be positioned closer to the photosensor 10 to provide the necessary light.

With reference now to FIG. 14, multiple photosensors 10 can be used and spaced apart from one another in order to determine location of the objects, speed of the objects, etc. There is typically a delay of a fraction of a second upon triggering a camera to expose film and take a photograph. There is also a delay in video in order to bring the camera up to speed. Such time delays can be critical in high-speed situations such as motorcycle or automobile races. Using these examples, if an automobile or motorcycle 74 passes between a first photosensor 10 and screen 54, the camera 66 can be activated so that it takes a proper picture or video footage at the finish line 62. The speed of the bicycle 74 or auto 76 or motorcycle 78 can also be determined by measuring the time delay between the two triggered photosensors 10.

The trigger system of the present invention provides many benefits over the prior art. The photosensor 10 does not require any battery power when operated in the passive or "no light" mode. The system is simple and uncomplicated in construction and set-up. The system does not require harmful laser light, or a reflective surface or active light beam. The photosensor 10 can sense action selectively on a roadway so as to trigger only on bicycles and not passing cars. The system, due to its simplicity, is also relatively inexpensive.

Although several embodiments have been described in detail for purposes of illustration, various modifications may be made without departing from the scope and spirit of the invention. Accordingly, the invention is not to be limited, except as by the appended claims.

What is claimed is:

1. A photo-voltaic trigger system, comprising:
    a photosensor including a light-impermeable housing having a polarizing light filter positioned in a light receiving end of the housing, a lens disposed in the housing for focusing light onto a transducer; and
    a switch electronically coupled to the transducer for selecting a passive or active mode, wherein a trigger signal is generated in the passive mode when light is reflected into the photosensor, and wherein a trigger signal is generated in the active mode upon disruption of received light.

2. The system of claim 1, including a light source directed at the active mode photosensor, whereby the trigger signal is generated when an object disrupts the received light.

3. The system of claim 2, wherein the light source comprises a non-coherent light source in the visible or invisible light spectrum.

4. The system of claim 1, including an opaque screen spaced from the passive mode photosensor and aligned with the light receiving end thereof, and a source of light at least partially directed at the opaque screen, whereby light reflected from an object positioned between the screen and the photosensor generates the trigger signal.

5. The system of claim 4, wherein the opaque screen comprises a felt fabric screen.

6. The system of claim 4, wherein the light source comprises ambient light.

7. The system of claim 4, wherein the light source comprises an artificial light source in the visible or invisible spectrum.

8. The system of claim 7, wherein the light source comprises an array of light emitting diodes having a plurality of groups of light emitting diodes which are powered in a predetermined sequence.

9. The system of claim 8, wherein each group of light emitting diodes is directed at a different location between the photosensor and the screen.

10. The system of claim 4, wherein the photosensor comprises a plurality of photosensors spaced apart from one another and positioned generally opposite one or more opaque screens, the photosensors being electronically linked to a device for determining a variable of the object.

11. The system of claim 10, wherein the variable includes at least one of location, distance, and speed.

12. The system of claim 1, wherein the photosensor is electronically linked to a photographic system.

13. The system of claim 4, wherein the photosensor is electronically linked to a photographic system including a camera focused on the space between the screen and the photosensor and activated by the trigger signal.

14. The system of claim 13, including a flash device coupled with the camera and activated by the trigger signal.

15. The system of claim 1, including an alignment device attached to the housing of the photosensor.

16. The system of claim 1, wherein the photosensor housing is configured for attachment to a tripod.

17. A photo-voltaic trigger system, comprising:
    a photosensor including a light-impermeable housing having a polarizing light filter positioned in a light receiving end of the housing, a lens disposed in the housing for focusing light onto a transducer;

a switch electronically coupled to the transducer for selecting a passive or active mode; and an opaque screen spaced from the passive mode photosensor and aligned with the light receiving end thereof, and a source of light at least partially directed at the opaque screen, whereby light reflected from an object positioned between the screen and the photosensor generates a trigger signal, or a light source directed at the active mode photosensor, whereby a trigger signal is generated when an object disrupts the received light.

18. The system of claim 17, wherein the light source in the active mode comprises a non-coherent light source in the visible or invisible light spectrum.

19. The system of claim 17, wherein the light source in the passive mode comprises ambient light, or an artificial light source in the visible or invisible spectrum.

20. The system of claim 17, wherein the light source in the passive mode comprises an array of light emitting diodes having a plurality of groups of light emitting diodes which are powered in a predetermined sequence, wherein each group of light emitting diodes directed at a different location between the photosensor and the screen.

21. The system of claim 17, wherein the photosensor comprises a plurality of photosensors spaced apart from one another, the photosensors being electronically linked to a device for determining a variable of the object including at least one of location, distance, and speed.

22. The system of claim 17, wherein the photosensor is electronically linked to a photographic system including a camera focused on an area in front of the light receiving end of the photosensor and activated by the trigger signal.

23. The system of claim 17, including an alignment device attached to the housing of the photosensor.

24. The system of claim 17, wherein the photosensor housing is configured for attachment to a tripod.

25. A photo-voltaic trigger system, comprising:

an opaque screen;

a photosensor including a light-impermeable housing, a polarizing light filter positioned in a light receiving end of the housing and directed towards the screen, and a lens disposed in the housing for focusing light onto a trigger signal generating transducer;

a source of light at least partially directed at the screen, whereby light reflected from an object positioned between the screen and the photosensor generates the trigger signal.

26. The system of claim 25, wherein the light source comprises ambient light, or an artificial light source in the visible or invisible spectrum.

27. The system of claim 25, wherein the light source comprises an array of light emitting diodes having a plurality of groups of light emitting diodes which are powered in a predetermined sequence, wherein each group of light emitting diodes is directed at a different location between the photosensor and the screen.

28. The system of claim 25, wherein the photosensor comprises a plurality of photosensors spaced apart from one another and directed at one or more opaque screens, the photosensors being electronically linked to a device for determining a variable of the object positioned between the photosensors and screens, including at least one of location, distance, and speed.

29. The system of claim 25, wherein the photosensor is electronically linked to a photographic system including a camera activated by the trigger signal and focused on an area between the screen and the photosensor.

* * * * *